US006788135B1

United States Patent
Yunker et al.

(10) Patent No.: US 6,788,135 B1
(45) Date of Patent: Sep. 7, 2004

(54) TERMINATING PATHWAY FOR A CLOCK SIGNAL

(75) Inventors: Lisa Ann Yunker, Fort Collins, CO (US); Eric McCutcheon Rentschler, Fort Collins, CO (US); Peter Shaw Moldauer, Wellington, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/615,549

(22) Filed: Jul. 8, 2003

(51) Int. Cl.[7] .............................................. H01L 25/00
(52) U.S. Cl. ....................................... 327/565; 257/784
(58) Field of Search ................................ 327/565, 566, 327/567; 257/668, 779, 780, 781, 782, 784

(56) References Cited

U.S. PATENT DOCUMENTS 5,753,970 A * 5/1998 Rostoker .................... 257/668

6,601,125 B1 * 7/2003 Campbell ................... 710/305

* cited by examiner

Primary Examiner—Linh M. Nguyen

(57) ABSTRACT

A signal pathway is presented for routing clock signals from a clock driving device to a circuit component and on to a termination. The signal pathway employs a minimal stub to carry the clock signals to the circuit component without introducing excess signal distortions. A first signal line of the signal pathway is formed on a circuit board and extends from the clock driving device to a first terminal for interfacing with the circuit component. A second signal line of the signal pathway is routed on the circuit component from one end adjacent to and electrically coupled with the first terminal to an opposite end adjacent to and electrically coupled with a second terminal formed on the circuit board. The stub extends from the second signal line on the circuit component. A third signal line of the signal pathway extends on the circuit board from the second terminal to the termination.

25 Claims, 7 Drawing Sheets

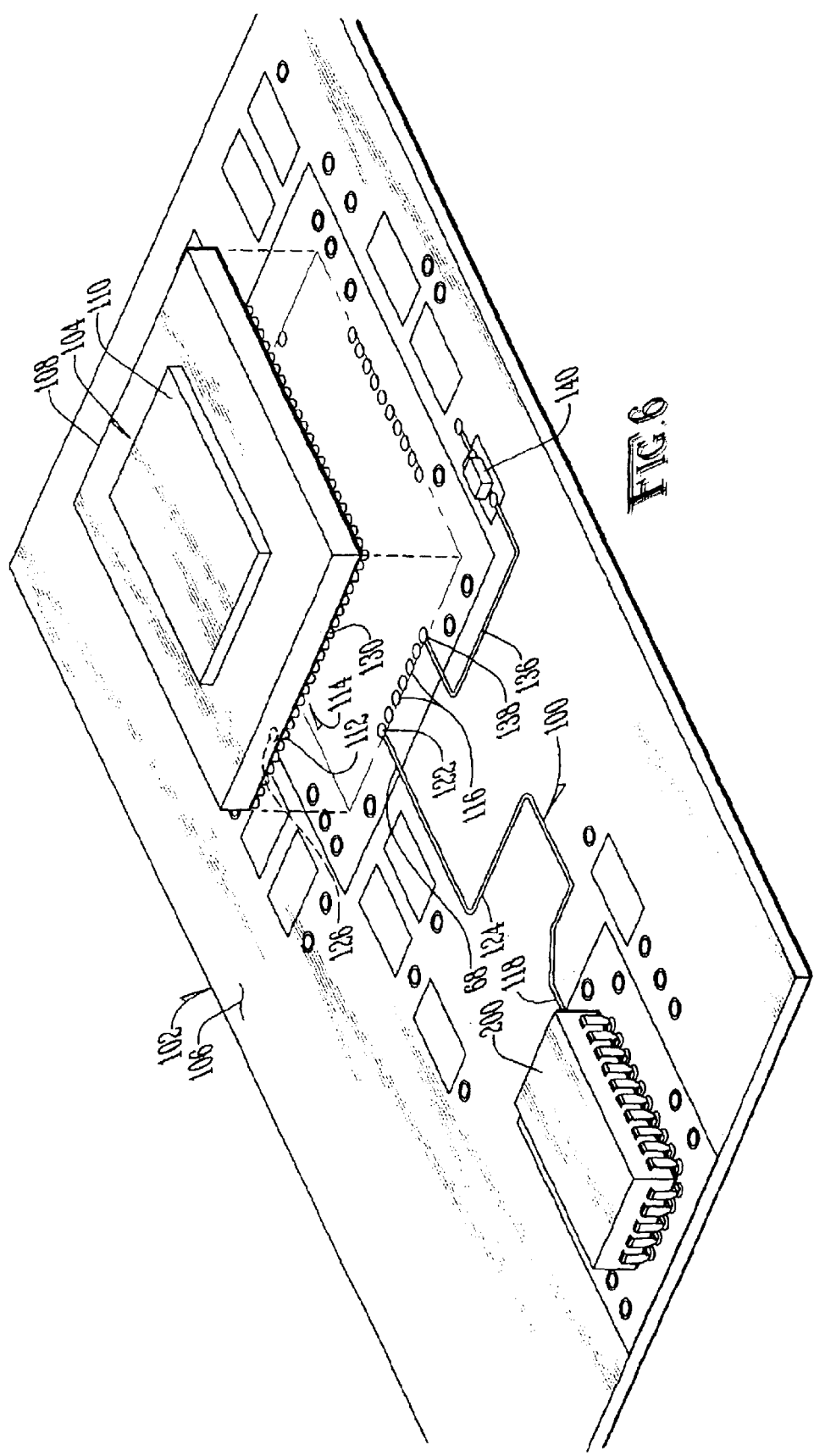

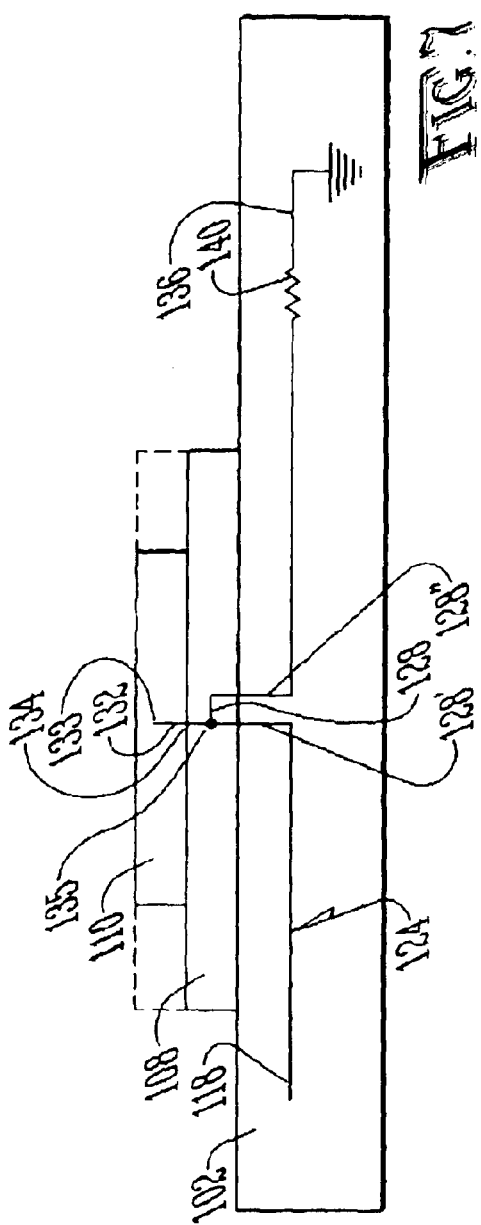
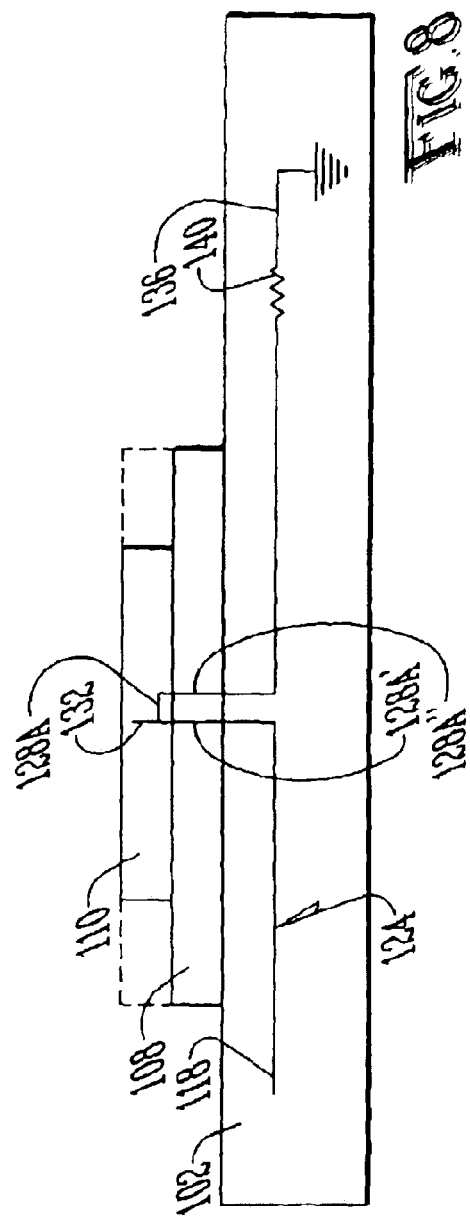

TERMINATING PATHWAY FOR A CLOCK SIGNAL

BACKGROUND OF THE INVENTION

1. Field of the Invention

The invention relates to the routing of electrical signals in a computing system, and more specifically, to a pathway for carrying clock signals to an integrated circuit chip and on to a termination.

2. Description of the Related Art

In a computing system, various circuit components must often work in a coordinated fashion to carry out a specified function. Examples of such components include processors and memory and I/O (input/output) controller chips. Coordination of these circuit components is enabled by running the components off the same system clock. The traces representative of the system clock are routed to each of these circuit components along a signal pathway formed on a circuit board of the computing system.

It is desirable to have a termination formed at the end of the signal pathway when routing relatively fast clock signals (e.g., around 250 MHz–300 MHZ+). The termination may be an "active" termination comprising a circuit specifically designed to handle clock signals in a given speed range, or a "passive termination", for example comprising merely one or more resistors. The function of the termination is to attenuate signal noise generated in the pathway by signal reflections of such fast clock signals. As computer system and component architecture has evolved, circuit components that receive clock signals are more commonly designed with a termination within the component (or the associated package) itself. This is often the best scenario for minimizing unwanted signal noise. However, certain circuit components have been designed without such a termination formed thereon; the termination is either omitted altogether, which is undesirable, or is placed on the circuit board at a location along the signal pathway. Also, when the termination is formed off of the circuit component, a stub is formed in the signal pathway, which represents the part of the pathway where clock signals are carried in both directions (i.e., to and from the component). As a general rule, as the speed of the clock signals increase, a shorter stub is required such that signal reflections and signal quality distortion is minimized.

One potential signal pathway 10 design with termination is shown in FIG. 1, for a memory and I/O controller chip unit 12 mounted onto a surface 13 of a circuit board 14. The memory and I/O controller chip unit 12 comprises a package 16 and an integrated circuit chip 18, or die, mounted with the package. The signal pathway 10 originates at a first end 20 electrically coupled with a clock signal driver (not shown) mounted on the circuit board 14. The signal pathway 10 is routed on the circuit board 14 and extends across an interface 22 (e.g., a ball grid array) between the circuit board 14 and the chip unit 12 onto the package 16 and to the circuit chip 18 to form a second end 24. A resistive termination 26 is placed along the signal pathway 10 between the first end 20 and the interface 22, thereby forming a stub 28 of the pathway 10 between the termination 26 and the pathway second end 24. A clock signal generated by the signal driver would travel from the first end 20 along the signal pathway 10 to the circuit chip 18 at the second end 24, and return along the pathway to the resistive termination 26. Because the interface 22 is formed as a ball grid, it is not possible to place the resistive termination 26 at that location. Additionally, a "keepout" area 30 is commonly required around the perimeter of the chip unit 12 on the circuit board surface 13, such that the resistive termination 26 must be further spaced away from the pathway second end 24. Thus, the signal pathway 10 shown in FIG. 1 forms a stub 28 that is excessively long for use with relatively fast clock signals. Depending on the particular memory and I/O controller chip unit 12 chosen, the stub 28 could exceed 35 mm in length.

FIG. 3 shows another signal pathway SO design with termination that could potentially be used to route clock signals in a computing system. Similar to FIG. 1, a memory and I/O controller chip unit 52 is mounted onto a surface 53 of a circuit board 54, and comprises a package 56 and an integrated circuit chip 58 mounted therewith. The signal pathway 50 is routed along the circuit board 54 from a first end 60 thereof electrically coupled with a clock signal driver to a second end 62 thereof where a resistive termination 64 is formed. A stub base 66 is formed on the signal pathway 50 from which a stub 68 extends across a single pad 70 of a ball grid array interface 72 between the circuit board 54 and the chip unit 52 to the circuit chip 58. A clock signal generated by the signal driver would travel from the first end 60 along the signal pathway 10 to stub 68, reaching the circuit chip 58, and returning back to the stub base 66 and onto the resistive termination 64 at the second end 62.

The signal pathway 50 of FIG. 3 is preferred to the pathway 10 of FIG. 1 for two reasons. First, the resistive termination 64 of the signal pathway 50 of FIG. 3 is at the end of the pathway 50, as opposed to being in the middle of the pathway, as with signal pathway 10 of FIG. 1. Second, the stub 68 of the signal pathway 50 of FIG. 2 is shorter than the stub 28 of signal pathway 10 of FIG. 1. Both of these features provide improved signal noise attenuation in signal pathway 50 of FIG. 3 over signal pathway 10 of FIG. 1. However, in computing systems utilizing relatively fast clock signals, the stub 68 of the signal pathway 50 of FIG. 3 remains often unacceptably long, leading to compromised signal integrity. Therefore, providing a solution for a signal pathway design that carries clock signals to a circuit component in a computing system and effectively controls unwanted signal noise has remained elusive.

SUMMARY OF THE INVENTION

The present invention provides a signal pathway having a termination and being configured to deliver clock signals to a circuit component mounted with a circuit board. The signal pathway has separate signal lines formed on the circuit hoard, which each extend to a separate terminal for electrical coupling with a circuit component. The signal lines of the circuit board are themselves electrically connected together with one or more signal lines formed on the circuit component by extending from one pad interfaced with the terminal of one circuit board signal line to another pad interfaced with the terminal of another circuit board signal line. One of the signal lines on the circuit board is considered a "Signal In" line, and has an end opposite of the interface terminal that is connected with a clock driver. Another signal line on the circuit board is likewise considered a "Signal Out" line, and has an end opposite of the interface terminal that is connected with a termination.

In one aspect, the circuit component comprises a package and an integrated circuit chip mounted with the package, with the signal line of the circuit component being routed on the package. A stub extends from the signal line on the package to carry the clock signal to the integrated circuit chip, and back to the signal line for routing on to the Signal Out line on the circuit board. The speed of the clock signals will dictate the desired length for the stub. For example, clock signals having a frequency of at least about 250 MHz should, preferably, require a stub length of about 2 mm or less to maintain acceptable clock signal integrity.

In another aspect, the termination on the Signal Out line is a resistive termination comprising one or more resistors. The resistive termination preferably has an impedance that matches the impedance of the signal pathway.

Thus, the signal pathway of the present invention provides an improved route for carrying clock signals to a circuit component while providing proper termination of such signals on a circuit board. The signal pathway design facilitates the attenuation of unwanted noise in the signals when a termination is not incorporated into the design of the particular circuit component.

BRIEF DESCRIPTION OF THE DRAWINGS

FIG. 6 is an exploded view of the clock signal pathway of FIG. 5;

FIG. 7 is a circuit diagram of the clock signal pathway of FIG. 5; and

FIG. 8 is a circuit diagram of an alternative embodiment of the clock signal pathway of the present invention.

DETAILED DESCRIPTION OF THE INVENTION

Figure 1:
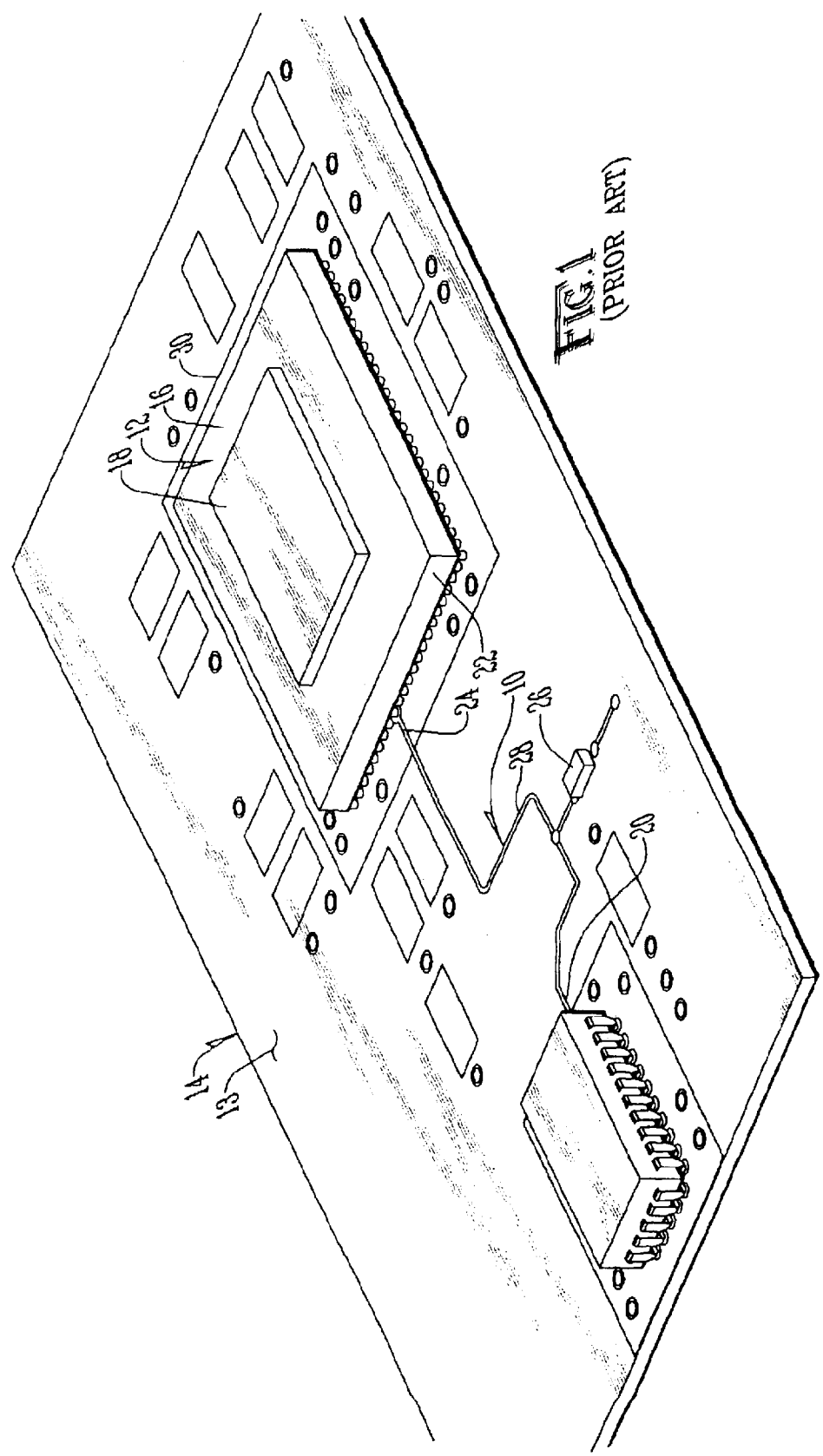
FIG. 1 is a perspective view of a prior art clock signal pathway on a circuit board having a stub extending to a circuit component and a termination disposed between the ends of the signal pathway.
Figure 2:
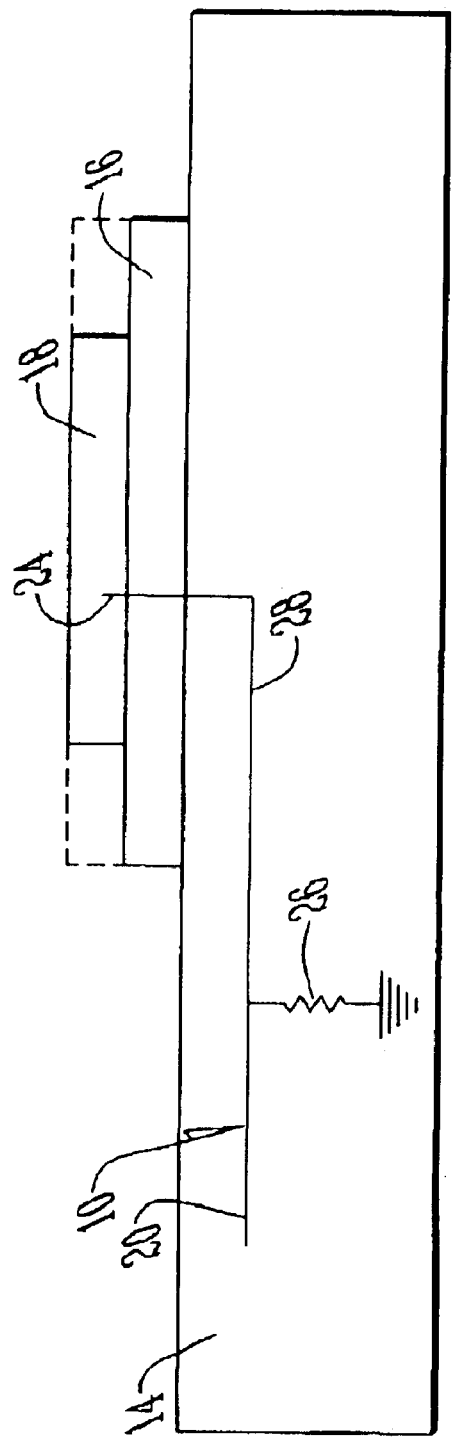
FIG. 2 is a circuit diagram of the prior art signal pathway of FIG. 1.
Figure 3:
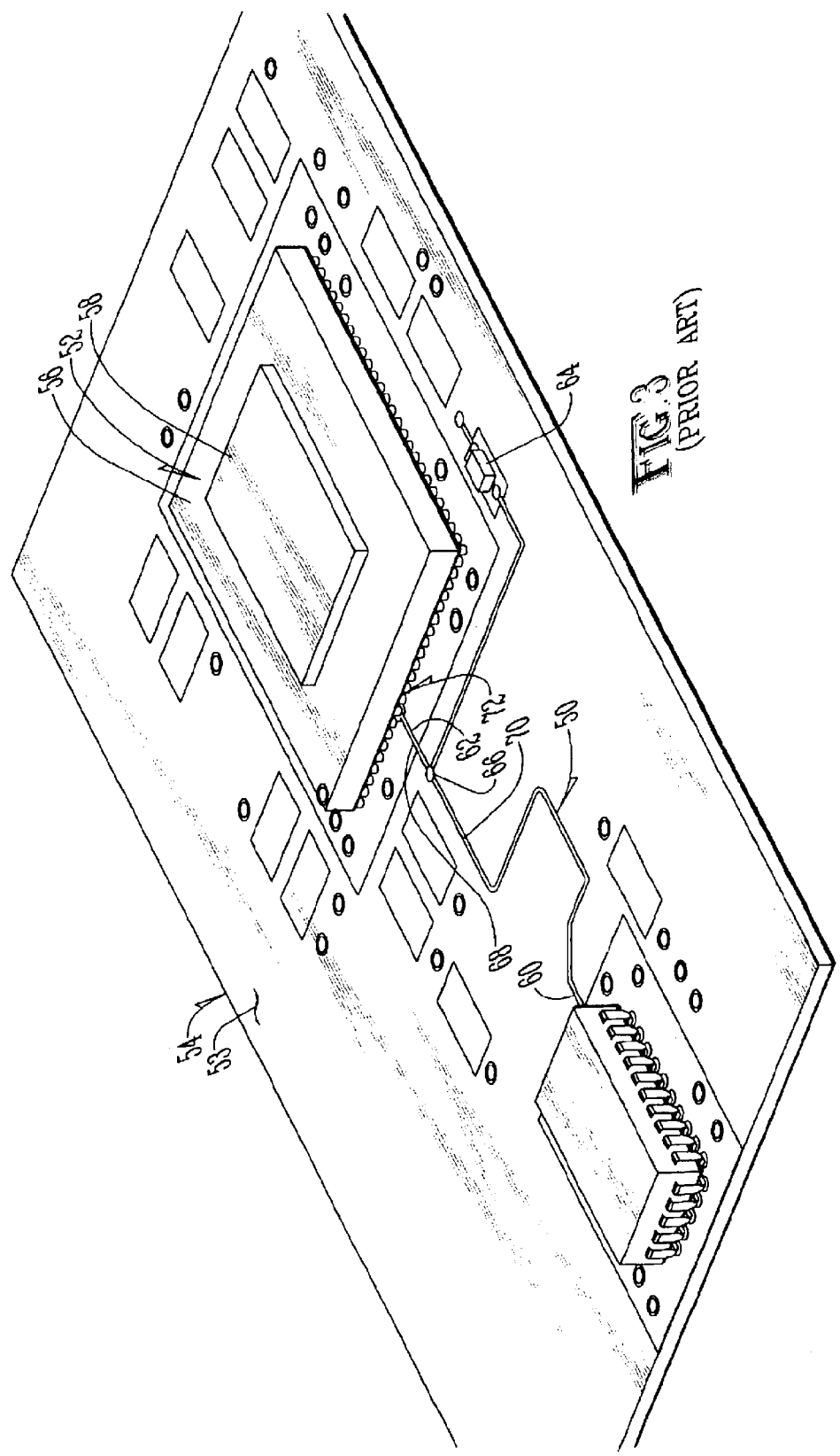
FIG. 3 is a perspective view of an alternative prior art clock signal pathway on a circuit board having a stub extending to a circuit component and a termination disposed at one end of the signal pathway.
Figure 4:
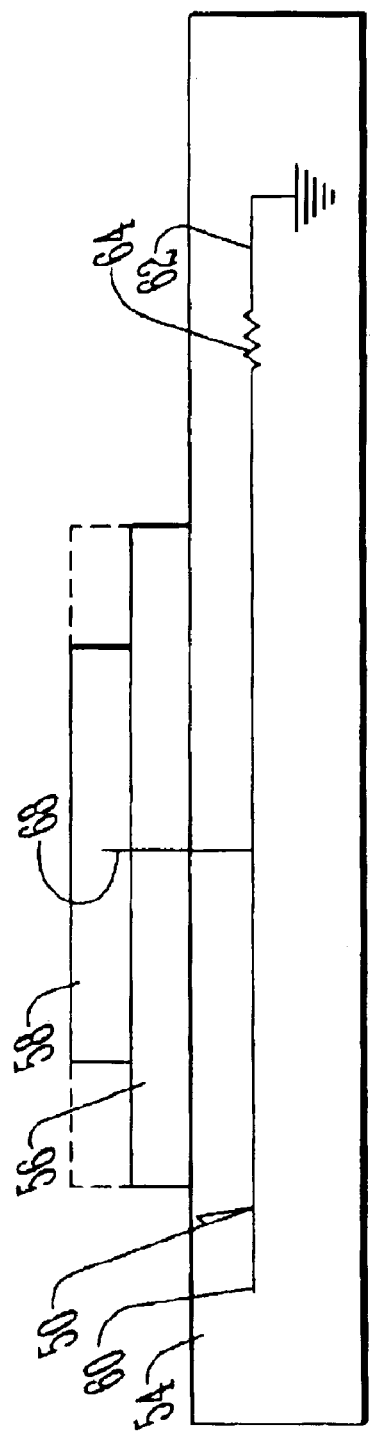
FIG. 4 is a circuit diagram of the prior art signal pathway of FIG. 3.
Figure 5:
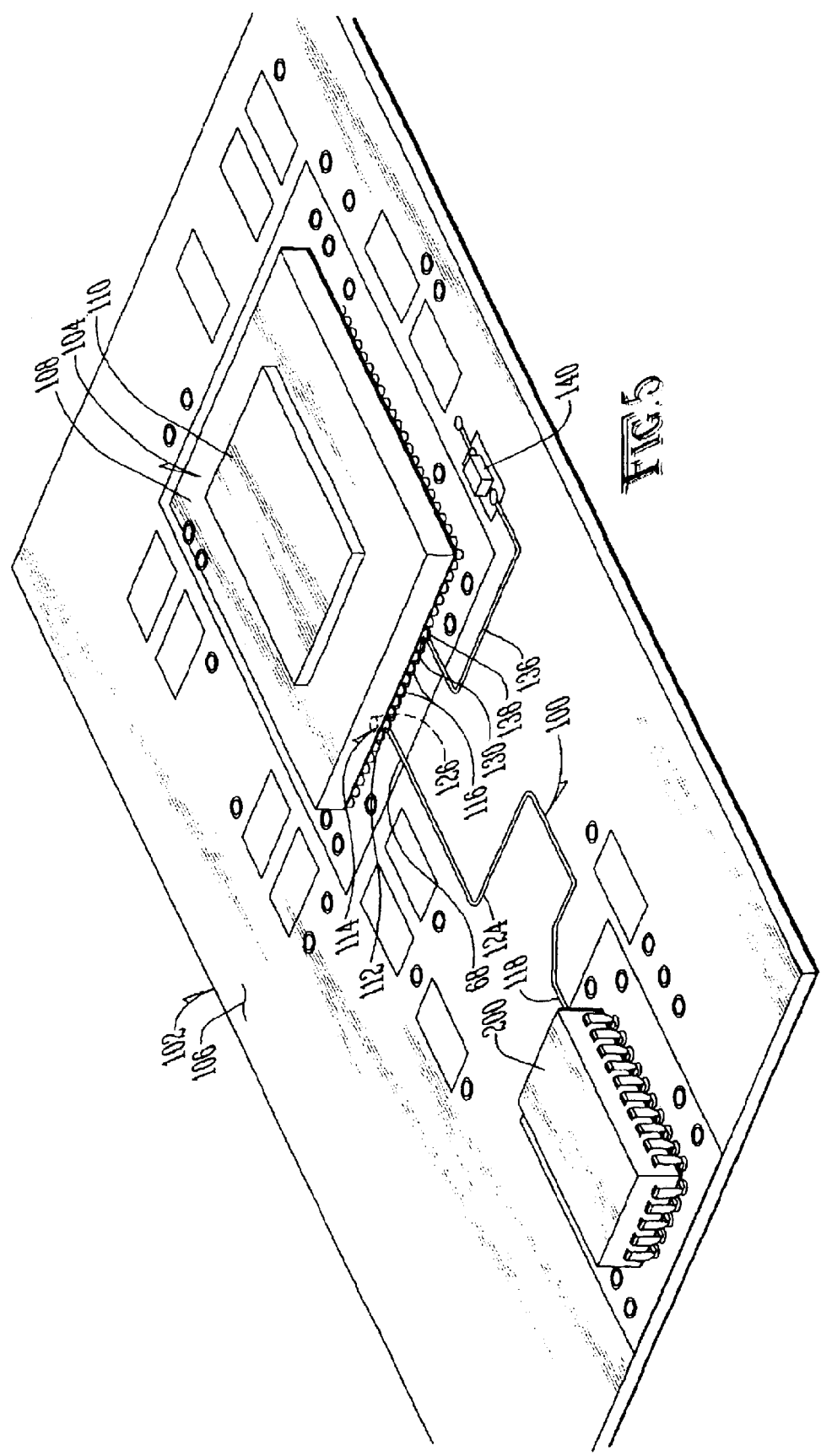
FIG. 5 is a perspective view of a clock signal pathway of the present invention showing the signal pathway routed from the circuit board to the circuit component and back to the circuit board to end at a termination thereon, with a stub extending on the circuit component.

A signal pathway 100 of the present invention for carrying clock signals is shown in FIG. 5 routed from a circuit board 102 to a circuit component specifically, a memory and I/O controller chip unit 104. The circuit component may also be referred to as a "receiver", as the component receives clock signals to coordinate functions with other circuit components in a computing system. The chip unit 104 is mounted onto a surface 106 of the circuit board 102 for electrical connection therewith, and comprises a package 108 and an integrated circuit chip 110 mounted with the package 108. The package 108 has a set of pads 112 that form a ball grid array interface 114 for electrical coupling and mounting with a set of terminals 116 on the circuit board surface 106.

Although a ball grid array interface 114 is used with the particular circuit component of FIGS. 5 and 7 (i.e., the memory and I/O controller chip unit 104), other types of interfaces, such as pin grid arrays, may be used as a matter of design choice. Also, other exemplary circuit components that utilize a signal pathway 100 includes processor chip units having a package and a processor chip in generally the same configuration as chip unit 104.

The signal pathway 100 begins at a first end 118 thereof on the circuit board 102, and may include a single conductive trace, or multiple conductive traces running generally parallel to one another. A clock driving means, such as a clock driver chip 200, is electrically coupled with the pathway first end 118 by mounting onto the circuit board surface 106. In this way, the first end 118 of the pathway 100 serves as one or more terminals for connecting with the clock driver chip 200. The signal pathway 100 extends across a portion of the circuit board 102 from the first end 118 to a first terminal 122 (shown in FIG. 6) of the set of terminals 116 where the memory and I/O controller chip unit 104 is mounted to define a first signal line 124. Because the first signal line 124 fuctions to bring a clock signal generated by the clock driver chip 200 to the memory and 1/0 controller chip unit 104, the line 124 may also be referred to as a "Signal In" line.

A first pad 126 of the set of pads 112 of the ball grid array interface 114 formed on the package 108 electrically couples with the first terminal 112 to route clock signals from the first signal line 124 to the memory and I/O controller chip unit 104. The first pad 126 may also be referred to as a "Signal In" pad. A second signal line 128 extends from the first pad 126 to a second pad 130 of the ball grid array interface 114. Similarly, the second pad 130 may also be referred to as a "Signal Out" pads A stub 132 extends from the second signal line 128 on the package 108 to an interface 134 between the integrated circuit chip 110 and the package 108 where the stub 132 has a termination end 133. The terminating end 133 of the stub 132 is electrically coupled with the chip 110. If desired, the stub terminating end 133 can extend into the structure of the chip 110 beyond the interface 134 for electrical connection therewith. However, the extent to which the stub terminating end 133 extends beyond the interface 134 must be reconciled with the desire to keep the stub 132 as short as possible to minimize any distortions of clock signals carried by the stub. The stub 132 may extend from the second signal line 128 at any point between the first pad 126 and the second pad 130, but to keep the stub length reasonably short, the stub 132 ideally extends from a portion of the second signal line 128 in close proximity to the integrated circuit chip 110. In one exemplary arrangement, when relatively fast clock signals—in at least the 250 to 300 MHz range—are routed, the stub 132 should have a length of about 2 mm or less to maintain acceptable signal integrity.

Alternatively, the second signal line 128 can be described as two separate signal lines 128', 128" formed together. The signal line 128' extends from the first pad 126 to a base 135 of stub 132, and the signal line 128" extends from the stub base 135 to the second pad 130.

A third signal line 136 extends from a second terminal 138 of the set of terminals 116 across a portion of the circuit board 102 to a termination 140. The second terminal 138 is electrically coupled with the second pad 130 to route clock signals from the memory and I/O controller chip unit 104 back to the circuit board 102 along the third signal line 136.: As such, the third signal line 136 may also be referred to as a "Signal Out" line. The combination of the first signal line 124, the second signal line 128, the stub 132 and the third signal line 136 form the signal pathway 100. Also, the termination 140 is preferably a "passive" termination design formed of merely one or more resistors whose impedance is matched to the impedance of the signal pathway 100.

In an alternative embodiment, the second signal line 128A extends from the first pad 126 to a second pad 130 of the ball grid array interface 114. Unlike the first embodiment, the second signal line 128A extends through the package 108 to the integrated circuit chip 110. Stub 132 extends from the second signal line 128A to its termination end 133 inside integrated circuit chip 110. The terminating end 133 of the stub 132 is electrically coupled with the chip 110. Second signal line comprises two separate signal lines 128A', 128A" formed together. The signal line 128A' extends from the first pad 126 to inside the integrated circuit chip 110, and the signal line 128A" extends from 128A' to the second pad 130. A third signal line 136 extends from a second terminal 138 of the set of terminals 116 across a portion of the circuit board 102 to a termination 140. The second terminal 138 is electrically coupled with the second pad 130 to route clock signals from the memory and I/O controller chip unit 104 back to the circuit board 102 along the third signal line 136. The combination of the first signal line 124, the second signal line 128A, the stub 132 and the third signal line 136 form the alternative embodiment of the signal pathway 100 of the present invention. Also, the termination 140 is preferably a "passive" termination design formed of merely one or more resistors whose impedance is matched to the impedance of the signal pathway 100.

For each exemplary embodiment, the first signal line 124, the second signal line 128 or 128A, and the third signal line 136 of the signal pathway 100 ideally are routed to have as few discontinuities as possible, to minimize impedance mismatches and capacitive loading that degrade the integrity of the waveform of the clock signal received by the integrated circuit chip 110. The stub 132 itself is a discontinuity, hence the need to keep the stub as short as possible while properly routing the clock signal to the integrated circuit chip 110.

In operation, the clock driver chip 200 generates a clock signal that is carried by the first signal line 124 to the first terminal 112, across the ball grid array interface 114 with a first pad 126 to the second signal line 128 and to the stub 132 that carries the signal to the integrated circuit chip 110, The clock signal is then returned from the integrated circuit chip 110 via the stub 132 to the second signal line and is carried across the ball grid array interface 114 from the second pad 130 to the second terminal 138 to the third signal line 136 and on to the termination 140.

EXAMPLE

In one example, a clock signal termination simulation was run with signal pathway 100 formed with the circuit board 102 and the memory and I/O controller chip unit 104. The clock signal frequency was set at 300 MHz and the clock driver chip 200 was configured to drive the clock signals with a relatively fast rise time of 200ps. The clock signals generated were measured at the interface 134 between the integrated circuit chip 110 and the package 108 at the position to which the stub terminating end 133 extends. The differential clock wave forms measured had an acceptably smooth signal pattern with a maximum overshoot voltage of 1.0 volts and a minimum undershoot voltage of −0.10 volts.

Thus, the signal pathway 100 of the present invention provides a routing solution for clock signals from a circuit board to a circuit component mounted therewith when it is not practical to form a termination on the circuit component. The design of the signal pathway implements a stub of a minimal length to carry the clock signals to the circuit component, and a resistive termination on the circuit board that has an impedance to match the impedance of the signal pathway 100. The present invention ensures that clock signal integrity can be maintained even as clock signal speed increases to high frequency values.

While certain changes may be made in the above invention without departing from the scope thereof, it is intended that all matter contained in the above description or shown in the accompanying drawing be interpreted as illustrative and not in a limiting sense. It is also to be understood that the following claims are to cover certain generic and specific features described herein.

What is claimed is:

1. A signal pathway from a clock signal driver to a termination, the signal pathway being configured to minimize signal reflections and signal degradation, the signal pathway comprising:

a first signal line formed on a circuit board and having a first end electrically connected to the clock signal driver and a second end forming a first terminal;

a second signal line formed on a circuit component mounted to the circuit board, the second signal line being electrically connected to the first terminal of the first signal line at a first pad, the second signal line extending from the first pad and having a portion forming a stub within the circuit component;

a third signal line electrically connected to the second signal line and extending therefrom at a point within the circuit component to a second pad; and a fourth signal line formed on the circuit board, the fourth signal line having a first end electrically connected to the third signal line at the second pad and a second end forming a termination;

whereby clock signals generated by the clock signal driver travel from the clock signal driver to the stub and on to the termination.

2. The signal pathway of claim 1, wherein the circuit component comprises an integrated circuit having a package and a die to the package, the stub having a terminating end extending into the integrated circuit.

3. The signal pathway of claim 2, wherein the third signal line extends within the package.

4. The signal pathway of claim 1, wherein the circuit component comprises a package and a die mounted to the package, the stub having a terminating end extending to the die.

5. The signal pathway of claim 4, wherein the third signal line extends within the package.

6. The signal pathway of claim 1, wherein the stub has a length of about 2 mm or less.

7. The signal pathway of claim 1, wherein the first pad and the second pad are each ball grid array pads.

8. The signal pathway of claim 1, wherein the termination comprises at least one termination resistor.

9. The signal pathway of claim 8, wherein the impedance of the termination resistor is approximately the same as the total impedance of the signal pathway up to the termination resistor.

10. A signal pathway formed on an integrated circuit mounted to a circuit board, the integrated circuit comprising a package and a die, the signal pathway comprising:

a first integrated circuit signal line extending into the package from a signal-in pad disposed on the surface of the circuit board, the first integrated circuit signal line forming a stub extending at least to an interface of the die and the package; and a second integrated circuit signal line branching from the first signal line portion at a base of the stub and extending to a signal-out pad;

whereby clock signals may enter the integrated circuit at the signal-in pad and exit the integrated circuit at the signal-out pad.

11. The signal pathway of claim 10, wherein the stub has a length of about 2 mm or less.

12. The signal pathway of claim 10, wherein the stub extends into the die of the integrated circuit.

13. A signal pathway for carrying clock signals from a clock driver to a circuit component mounted to a circuit board, the signal pathway having a termination on the circuit board and being configured to minimize signal reflections and signal degradation, the signal pathway comprising:
- a first signal line formed on a circuit board and electrically connected to a clock driver, the first signal line extending to a first terminal;
- a second signal line formed on the circuit board and extending from a second terminal to a termination;
- a third signal line formed in the circuit component, the third signal line extending from a signal in pad electrically connected to the first terminal to a signal out pad electrically connected to the second terminal; and
- a stub electrically connected to the second signal line on the circuit component.

14. The signal pathway of claim 13, wherein the circuit component comprises a package and a die mounted to the package, the stub extending to the die for electrical connection therewith.

15. The signal pathway of claim 13, wherein the stub has a length of about 2 mm or less.

16. The signal pathway of claim 13, wherein the termination comprises at least one termination resistor.

17. The signal pathway of claim 16, wherein the impedance of the termination resistor is approximately the same as the total impedance of the signal pathway up to the termination resistor.

18. An electronic system, comprising:
- a circuit board having an interface;
- a circuit component mounted onto the circuit board interface to electrically couple the circuit component to the circuit board; and
- a signal pathway, comprising:
  - a first signal line formed on the circuit board and electrically connected to a clock driving means, the first signal line extending to a first terminal;
  - a second signal line formed on the circuit board and extending from a second terminal to a termination;
  - a third signal line formed on the circuit component, the third signal line extending from a signal in pad electrically coupled to the first terminal at the circuit board interface to a signal out pad electrically coupled to the second terminal at the interface; and
  - a stub electrically coupled with the third signal line on the circuit component.

wherein the clock driving means generates clock signals to be carried by the signal pathway to the circuit component and on to the termination.

19. The system of claim 18, wherein the circuit component comprises a package and a processing chip mounted to the package, the stub extending to the processing chip for electrical connection therewith.

20. The system of claim 18, wherein the circuit component comprises an integrated circuit having a package and a die mounted within the package, the stub extending to the die for electrical connection therewith.

21. The system of claim 18, wherein the stub has a length of about 2 mm or less.

22. A method for routing a clock signal to a receiver whereby a waveform of the clock signal has an acceptably low amount of noise at the receiver, the receiver comprising circuit component, the method comprising the steps of:
providing a signal pathway, comprising:
- a first signal line formed on a circuit board and electrically connected to a clock driver, the first signal line extending to a first terminal;
- a second signal line formed on the circuit board and extending from a second terminal to a termination;
- a third signal line formed on the circuit component mounted to the circuit board, the third signal line extending from a signal in pad electrically coupled with the first terminal to a signal out pad electrically coupled with the second terminal; and
- a stub electrically coupled with the third signal line on the circuit component; and driving the clock signal, by the clock driver, along the signal pathway to the circuit component and on to a termination.

23. The method of claim 22, wherein the circuit component comprises a package and a processing chip mounted to the package, the stub having a terminating end disposed within the processing chip, and wherein the step of driving a clock signal comprises driving the clock signal, by the clock driver, along the signal pathway to the processing chip and on to the termination.

24. The method of claim 22, wherein the circuit component comprises a package and a die mounted to the package, the stub having a terminating end disposed within the die, and wherein the step of driving a clock signal comprises driving the clock signal, by the clock driver, along the signal pathway to the die and on to the termination.

25. The method of claim 22, whereby when the clock signal waveform has a cycle time of at least about 300 MHz, and wherein the clock signal voltage measured at the circuit component does not exceed 1.2 volts and does not drop below −0.25 volts.

* * * * *